(12) United States Patent
Kingswood et al.

(10) Patent No.: US 6,584,303 B1
(45) Date of Patent: Jun. 24, 2003

(54) METHOD AND APPARATUS FOR AUTOMATICALLY IDENTIFYING A FUNCTION MODULE IN A MODULAR TRANSCEIVER SYSTEM

(75) Inventors: Andrew Christopher Kingswood, North Andover (GB); Timothy Land, Hampshire (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/506,538

(22) Filed: Feb. 17, 2000

Related U.S. Application Data

(63) Continuation of application No. PCT/EP98/05114, filed on Aug. 5, 1998.

(30) Foreign Application Priority Data

Aug. 20, 1997 (GB) .............................................. 9717672

(51) Int. Cl.[7] ................................................ H04B 7/00
(52) U.S. Cl. .......................... 455/73; 455/349; 455/561
(58) Field of Search .......................... 455/90, 575, 571, 455/572, 573, 574, 550, 556, 557, 73, 78, 88, 561, 349

(56) References Cited

U.S. PATENT DOCUMENTS 5,193,219 A * 3/1993 Tamura ........................ 455/89
5,479,479 A 12/1995 Braitberg et al.
5,524,044 A * 6/1996 Takeda ........................ 455/89
5,715,245 A * 2/1998 Suonvieri .................... 370/337
5,857,151 A * 1/1999 Heinonen et al. ........... 455/349

FOREIGN PATENT DOCUMENTS

| DE | 43 19 961 | 12/1994 |
| EP | 0 602 608 | 6/1994 |
| EP | 0 714 176 | 5/1995 |
| EP | 0 720 305 | 7/1996 |
| GB | 2 281 663 | 3/1995 |
| WO | 96/27242 | 9/1996 |
| WO | 98/44654 | 10/1998 |

OTHER PUBLICATIONS

Jan. 20, 1999, British Search Report for GB 9717672.1.

* cited by examiner

Primary Examiner—Edward F. Urban
Assistant Examiner—Tilahun Gesesse
(74) Attorney, Agent, or Firm—Squire, Sanders & Dempsey L.L.P.

(57) ABSTRACT

A functional module is provided for connection in a modular transceiver system in a radio communication network. The functional module has an input for receiving input signals at an RF frequency, an RF signal processor for receiving and processing the input signals, an ID generating circuit for generating an ID signal which characterises the functional module, and an ID port for transmitting the ID signal to an interrogation circuit. A self-configuring transceiver module for receiving and acting on the ID signal is also provided.

10 Claims, 9 Drawing Sheets

METHOD AND APPARATUS FOR AUTOMATICALLY IDENTIFYING A FUNCTION MODULE IN A MODULAR TRANSCEIVER SYSTEM

This is a continuation of PCT/EP98/05114 filed Aug. 5, 1998.

FIELD OF THE INVENTION

The present invention relates to a modular transceiver system and to identifying the modules therein. It particularly but not exclusively relates to a self configuring modular transceiver system which identifies the functionality of the attached modules.

BACKGROUND TO THE INVENTION

A mobile radio telecommunications network consists of at least one base station and a plurality of mobile stations. The mobile stations communicate with each other via the base station. The base station includes a base transceiver system which has at least one transceiver for communication with transceivers in the mobile stations. It is desirable for base transceiver systems to be adaptive so that end users can optimise the system for their needs. For example where there is considerable signal attenuation it may be desirable to boost the signal by providing a booster circuit within the base transceiver system, while where there is considerable traffic it may be preferable to include a second or third transceiver instead of the booster circuit. It is therefore desirable to market base transceiver systems as modular systems which can be modified or upgraded by the replacement or addition of functional modules. However, a base transceiver system is a complex collection of functional units and the successful aggregation of these units is a skilled and difficult task. It would be desirable if the base transceiver system was self-configuring. The end user could then simply attach the requisite functional modules to the base transceiver system and the system would configure itself to obtain a working system of the desired functionality.

SUMMARY OF THE INVENTION

According to one aspect of the present invention there is provided a functional module for connection in a modular transceiver system in a radio communication network operating at an RF frequency within a RF frequency range, comprising:

an input for receiving input signals at the RF frequency;

an RF signal processor connected to said input for receiving and processing said input signals;

an ID generating circuit for generating an identification signal characterising the functional module; and an ID port for transmitting the identification signal to an interrogation circuit in the transceiver system.

The functional module can be, for example, a power amplification module such as a booster module or a filter module.

The invention also provides a self-configuring transceiver module, for use in a modular transceiver system of a radio communication network operating at an RF frequency within an RF frequency range, the transceiver module comprising:

an RF unit for generating and receiving RF signals in the RF frequency range;

an ID port for receiving an identification signal from a connected functional module, said identification signal characterising said functional module; and detection circuitry for identifying the nature of the functional module from the identification signal and for configuring the transceiver system in response thereto.

This allows the transceiver module to automatically configure the transceiver system in accordance with the functional module which is connected thereto. Thus, there is no need for a user manually to determine the type of module being inserted into the modular transceiver system because the self-configuring transceiver module will automatically configure the transceiver system appropriately in accordance with the functional module which is connected.

The invention also provides in another aspect a method for automatically identifying a functional module in a modular transceiver system, said system operating within an RF frequency range, the method comprising the steps of:

supplying to the functional module a checking signal at a checking frequency outside said RF frequency range;

measuring the response of said functional module at said checking frequency, said response being characteristic of the nature of the functional module; and identifying the nature of the functional module on the basis of said response, and configuring the transceiver system accordingly.

This method allows the functional module to be identified by interrogation at a checking frequency, which, in the preferred embodiment, is d.c. However, the checking frequency need not be d.c. but could be a frequency which is significantly lower than the RF frequency, for example a $\frac{1}{10}$ or $\frac{1}{100}$ of the RF frequency.

A power source for the identification signal can either be included within the functional module or within the transceiver module. Where the power source is provided within the functional module the ID signal may be a voltage level, a current level or a serial data stream.

In the particularly preferred embodiment, a duplex connector in the form of a coaxial cable provides the input for receiving the RF signals and the identification port for transmitting the identification signal. This is made possible if the identification signal is at a frequency outside the RF frequency range, and preferably significantly lower than the RF frequency. The ID signal and the input signals can then be separated by a choke and capacitor arrangement within the functional module, and a similar such arrangement in the transceiver module.

The invention has particular benefit in a situation where the transceiver module has a power control loop which uses a fed-back detected power level from the output RF signal. The configuration of the power control loop has one arrangement in the presence of a filter module and a different arrangement in the presence of a booster amplifier module.

In an existing transceiver module, a peak power detector which is an element of the power control loop is located within the transceiver module. When a booster module is connected to the output of the transceiver module, a separate peak power detector within the booster module should be configured within the power control loop. Thus, the remaining power control circuitry within the power control loop of the transceiver module should use the output of the peak power detector in the booster module instead of the peak power detector in the transceiver module. As described in our earlier British Patent Application No. 9706423.2, this can be accomplished by means of a switch.

The above described aspect of the present invention enables this switch to toggle automatically upon detection of the presence of a booster module, and thus removes the need for operator intervention if a module based transceiver system becomes upgraded to utilise a booster module. It also has the benefit of standardising the transceiver module.

For a better understanding of the present invention and to show how the same may be carried into effect, reference will now be made by way of example to the accompanying drawings.

DESCRIPTION OF THE PREFERRED EMBODIMENT

Figure 1:
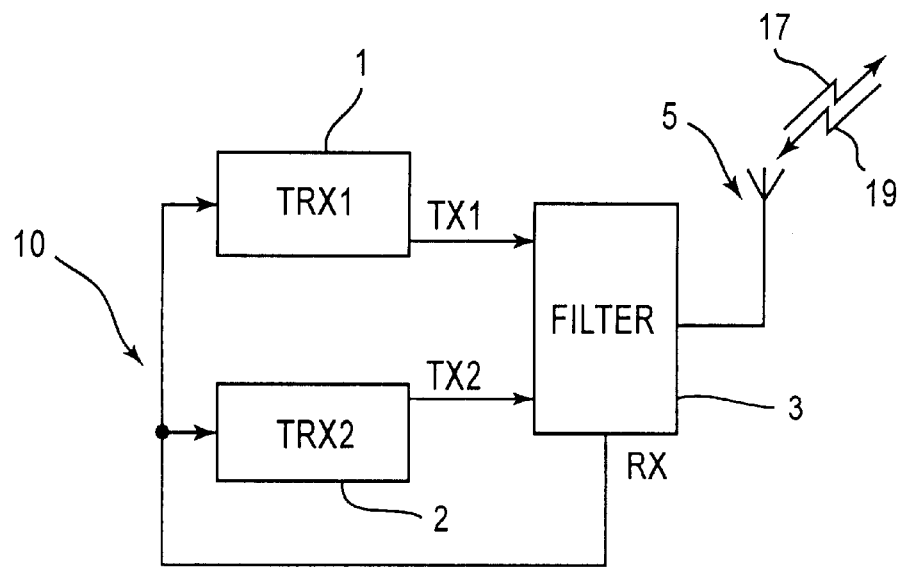
FIGS. 1 is a block diagram of a base transceiver system.

FIG. 1 is a block diagram of a base transceiver system 10 (BTS) in a mobile communication system by way of background. Each of two transceivers TRX1,TRX2 contains transmit and receive circuits which are known in the art. The outputs of the transmit circuits Tx1,Tx2 are connected to a filter 3 which supplies them in a form for transmission via an antenna 5. The transmitted radio signals are denoted by reference numeral 17. The antenna 5 also receives radio signals 19 from mobile stations and supplies these to the receive circuits in the transceivers TRX1,TRX2 as received signal Rx.

Figure 2:
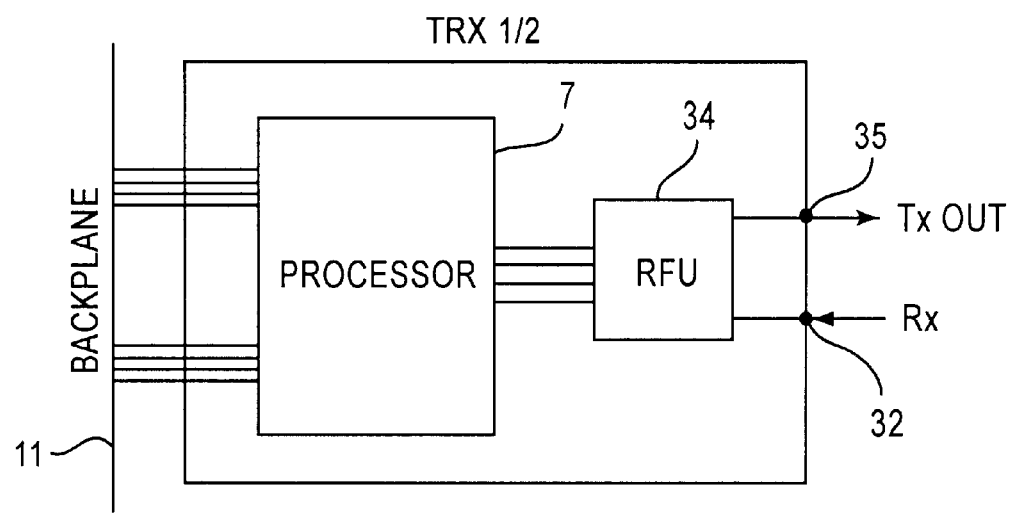
FIG. 2 is a block diagram of internal components of a transceiver module.

The transmit circuits include a modulation circuit for modulating data to be transmitted onto a carrier wave at an appropriate carrier frequency. At present, the GSM standard has a carrier frequency in the vicinity of 900 MHz actually Up-Link 890–915 MHz (mobile to BTS) and Down-Link 935–960 MHz (BTS to mobile). As shown in FIG. 2, each transceiver TRX comprises a processor 7 and an RF unit (RFU). Data to be transmitted is supplied from the processor 7. The processor 7 and RF unit also down-convert, filter, demodulate, and decode the received signal Rx supplied to it from the filter unit. The processor 7 also supplies control signals to the RF unit. In particular, the processor 7 supplies a power control signal Vc which controls the power level of the signal transmitted by the transceiver.

Figure 3:
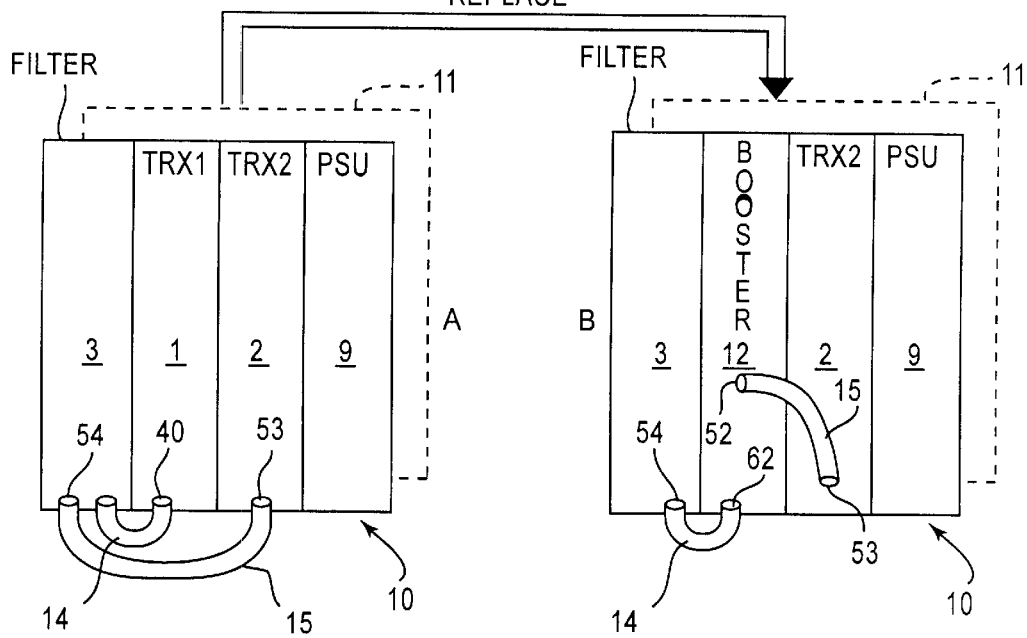
FIG. 3 is a diagram illustrating a modular based transceiver system.

FIG. 3 represents a modular structure of a base transceiver system 10. The base transceiver system 10 comprises a rack 11 with a backplane and a plurality of connectors (not shown) to which are respectively connected a plurality of modules. FIG. 3 illustrates in state A a filter module 3, a first transceiver module TRX1, a second transceiver module TRX2 and a power supply module PSU 9. There are other modules as necessary to implement the functionality of a base transceiver system. The transceivers are easily interchangeable by virtue of coaxial cable 14,15 connecting between each transceiver and the filter module 3. The coaxial connections illustrated in state A are those necessary for the transceivers TRX1,TRX2 to operate as transmitters, the necessary connections for them to operate as receivers are not shown. The advantage of a modular base transceiver system is that one module can be replaced by another of a different functionality. For example, the first transceiver TRX1 can be replaced by a booster module 12 by releasing the coaxial cable 14 from the connecter 40 on the first transceiver and connecting it to an output connecter 62 on the booster module. The coaxial cable 15 on the remaining transceiver TRX2 is connected to an input connecter 52 on the booster module 12.

Figure 4:
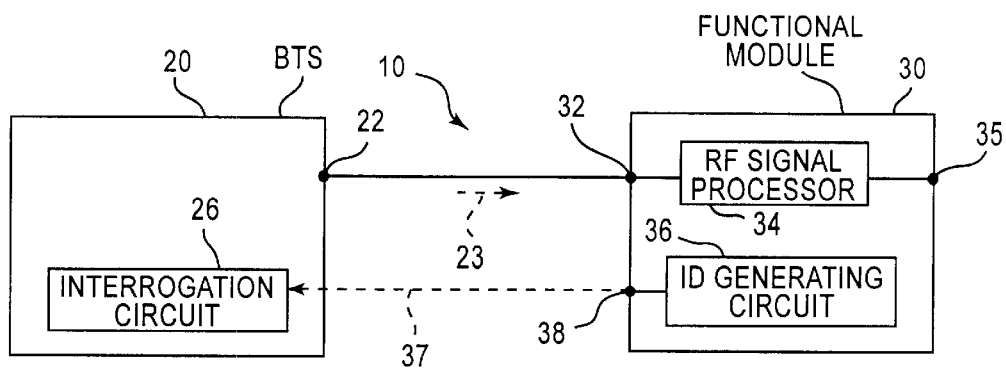
FIG. 4 is a block diagram illustrating the principle underlying various aspects of the present invention.

FIG. 4 is a diagram relating to a modular base transceiver system 10 and illustrative of aspects of the present invention. The base transceiver system 10 is made up of a plurality of functional modules, one of which is separately illustrated as functional module 30. The remaining module(s) are referred to by reference numeral 20 and for brevity will hence forth be referred to as BTS module 20. The combination of BTS module 20 and functional module 30 makes up the modular base transceiver system 10.

In the example of FIG. 3, the BTS module 20 comprises TRX2 and the power supply 9, while the functional module 30 could be either the filter 3 connected to the output 53 of TRX2, the booster module 12 connected to the output 53 of TRX2 (followed by a filter) or a power amplification module (not illustrated). Thus in the described embodiment, the functional module 30 has an input 32 for receiving radio frequency signals (RF signals) 23 from the output 22 of BTS module 20 . An RF signal processor 34 processes the RF signals 23 and presents its output at output 35. The RF signals are signals at a frequency at which they will be transmitted or at which they have been received. The functional module 30 also has an ID generating circuit 36 which presents an identification signal (ID signal) 37 at an ID port 38. The ID signal 37 identifies the functional module 30 as, for example, a booster module 12, power amplification module or a filter module 3. When the functional module 30 is a booster module, the RF signal processor boosts the power level of the signals from the TRX2 prior to transmission to the antenna 5. When the functional module 30 is a filter module, the RF signal processor filters the signals from the TRX (boosted if appropriate) prior to transmission to the antenna 5. When the functional module 30 is a power amplification module the RF signal processor amplifies the power level of the signals from the TRX2 prior to transmission. Power amplification may also occur before boosting and/or filtering. It will readily be appreciated that, as described, the TRX can be connected either directly to the filter module 3 or via the booster module 12 to the filter 3.

The BTS module 20 includes an interrogation circuit 26 which identifies the functional module 30 on the basis of the received ID signal 37 and configures the BTS module 20 in dependence on the identification of the connected functional module.

Each functional module 30 of a particular type produces the same ID signal, which distinguishes it from functional modules 30 of a different type. The ID signal may, for example be a voltage level, the level changing in dependence on the functionality of the module 30. The received ID signal 37 can then be compared with expected values to determine the functionality of the attached functional module 30. The identification of the type of functional module 30 can be used to control the operation of the base transceiver system 10 by configuring the BTS module 20 appropriately.

As described, the BTS module 20 and the functional module 30 are interconnected by a coaxial cable. Such a connection allows both RF signals 23 to pass from the BTS module 20 to the functional module 30 and ID signal 37 to pass from the functional module 30 to the BTS module 20.

As explained above the RF signals in the GSM standard are in the range 890–960 MHz, separated for Up-Link and Down-Link as defined earlier. Radio communication according to this standard occurs within this defined frequency range and the RF signals are confined to this range. When the BTS module 20 and functional module 30 are interconnected by a coaxial cable which simultaneously passes both RF signals 23 and ID signal 37, the ID signal is developed at DC or at such a low frequency that it can be carried along the same coaxial cable.

The ID signal 37 is generated in the ID generating circuit 36. However, the power source for this generation may be located either in the functional module 30, or in the BTS module 20 FIGS. 5a to 5c illustrate an ID generation circuit 36 and interrogation circuit 26 in which the power source for the ID signal 37 is within the functional module 30.

Figure 5A:
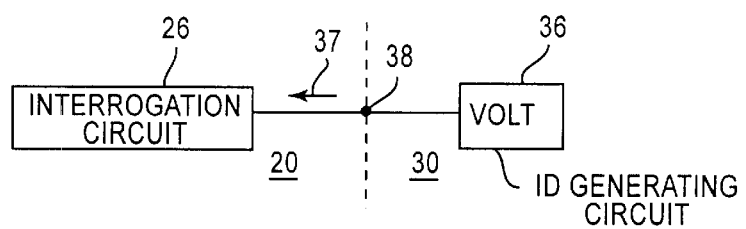
FIG. 5a is a schematic illustration of one embodiment of a base transceiver system.

FIG. 5a is a schematic illustration of one embodiment of a base transceiver system 10 comprising a BTS module 20 and functional module 30. The ID generating circuit 36 within the functional module 30 provides the power to establish and maintain the ID signal 37. The ID generating circuit 36 is a voltage source, the ID signal 37 is a voltage level and the interrogation circuit 26 of the BTS module 20 is a voltage level detector. Each type of functional module has a different voltage source as the ID generating circuit 36 and consequently provides a different voltage level as the ID signal 37. The interrogation circuit 26 measures the voltage level received and identifies the attached functional module 30. The identification may be achieved by comparison of the measured voltage level with stored voltage level values, where each of the stored voltage level values is associated with a particular type of functional module 30. In a preferred implementation the ID generating circuit 36 is a voltage source which provides a d.c voltage. Although the ID generating circuit 36 has been illustrated as a voltage source, any active generator would suffice e.g. a current source. The interrogation circuit 26 would then be adapted to respond to an ID signal in the form of an electric current.

Figure 5B:
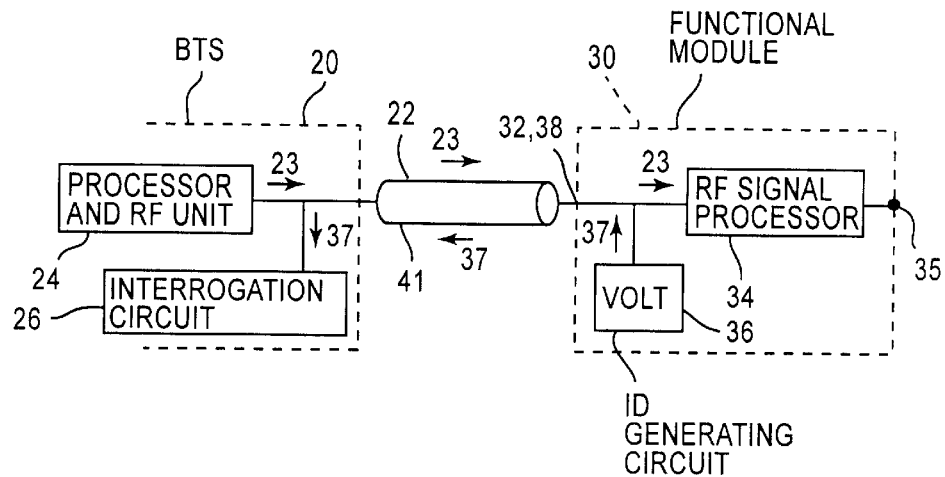
FIG. 5b is a schematic illustration of the embodiment of FIG. 5a using a duplex connector between the modules.

FIG. 5b illustrates a base transceiver system 10 utilising the circuitry of FIG. 5a, in which the RF signals 23 and the ID signal 37 pass between the BTS module 20 and the functional module 30 along a common interconnect. The common interconnect may be a coaxial cable as illustrated in FIG. 5b. The numerals of FIG. 5b, where common with FIG. 4 and FIG. 5a, refer to the same features. In functional module 30 the input 32 and the ID port 38 are common. The RF signals 23 received through this common port pass to the RF signal processor 34. The ID signal 37 produced by the ID generating circuit 36, in this case a voltage source, passes to the BTS module 20 through this common port 32,38 and the coaxial cable 41. Reference numeral 24 represents functional circuitry (e.g. the processor 7 and RF unit RFU) for providing the RF signals 23 which are presented at output 22 and pass along coaxial cable 41. The interrogation circuit 26 receives the ID signal 37 from the coaxial cable 41.

Figure 5C:
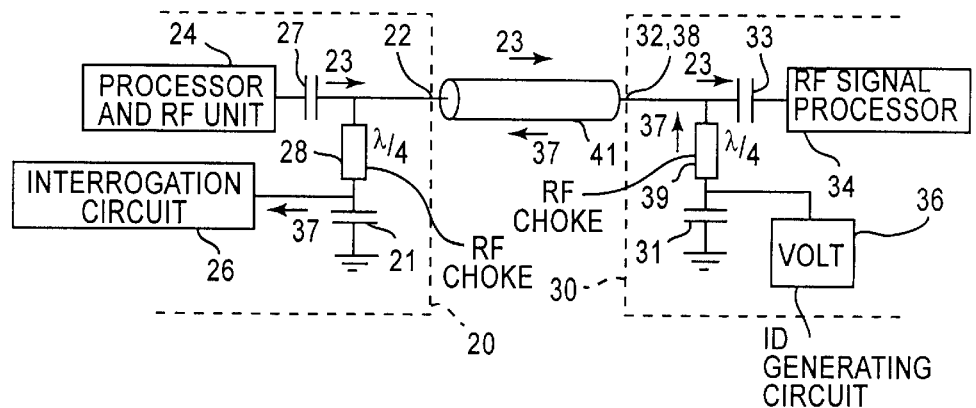
FIG. 5c is a schematic implementation of the embodiment of FIG. 5b.

FIG. 5c illustrates how the diagrammatic circuit of FIG. 5b might be implemented. The reference numerals of FIG. 5c which are common with FIG. 5b refer to the same features. The coaxial cable 41 supplies both the RF signals 23 from the BTS module 20 to the functional module 30 and the ID signal 37 from the functional module 30 to the BTS module 20, the ID signal 37 being at DC. This is achieved by use of an RF choke, for example an inductance or quarter wave track, and capacitors. The capacitor 33 is connected between the common port 32,38 and the RF signal processor 34. The capacitor 33 offers a low impedance to high frequency RF signals 23 and a high impedance to the d.c. ID signal 37 and consequently isolates the RF signal processor 34 from the ID signal 37 but does not prevent the supply of the RF signals 23. The capacitor 27 in the BTS module 20 operates in an exactly equivalent manner with respect to the functional circuitry 24. The RF choke 39 is connected between the common port 32,38 and the voltage source in the ID generating circuit 36. The RF choke 39 offers a high impedance to the high frequency RF signals 23 and a low impedance to the d.c. ID signal 37. The RF choke 39 consequently isolates the voltage source in the ID generating circuit 36 from the RF signals 23 while not preventing the passage of the ID signal 37. The RF choke 28 in the BTS module 20 operates in an analogous manner. The capacitor 31 in the functional module 30 is connected between the node connecting the output of the ID generating circuit 36 to the RF choke 39, and earth. It provides a low impedance path to earth for high frequency signals. The capacitor 21 in the BTS module 20 operates in an analogous manner.

The ID signal need not be at DC, but could be at a frequency significantly lower than that of the RF signals 23. The identification frequency is preferably 1/10 or even 1/100 of the frequency values in the defined frequency range.

The ID signal 37 generated by the voltage source in the ID generating circuit 36 consequently travels through the RF choke 39, common port 32,38, coaxial cable 41, RF choke 28 and is received at the interrogation circuit 26. The RF signals 23 produced in the functional circuitry 24 pass through capacitor 27, the coaxial cable 41, capacitor 33 and are received at the RF signal processor unit 34.

Figure 6A:
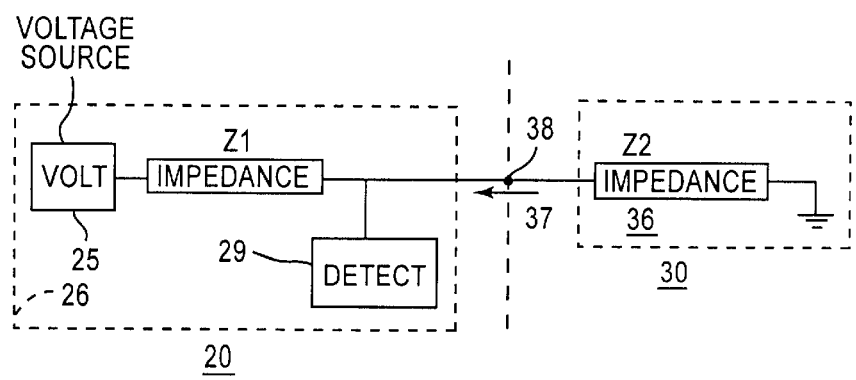
FIG. 6a is a schematic illustration of another embodiment of a base transceiver system.
Figure 6B:
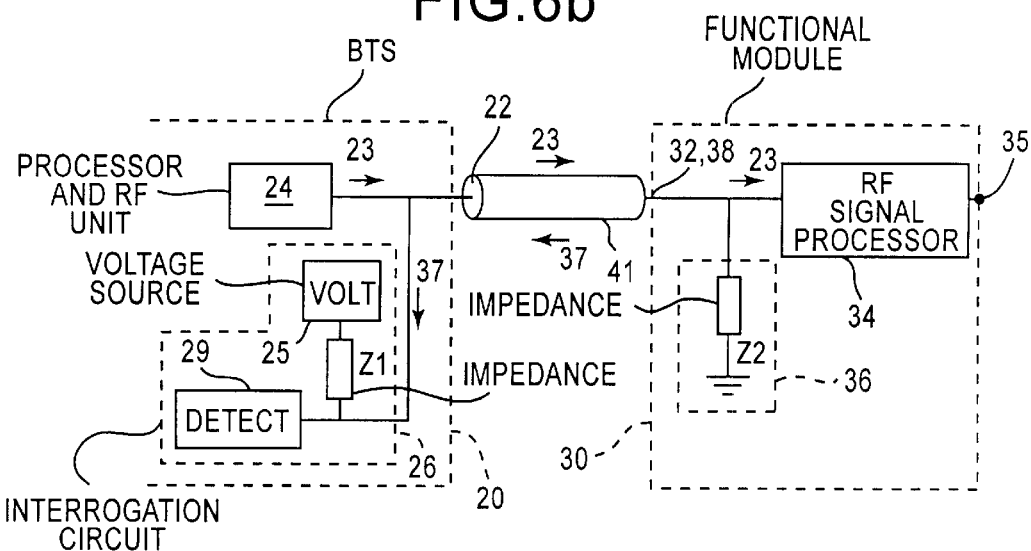
FIG. 6b is a schematic illustration of the embodiment of FIG. 6a using a duplex connector between the modules.
Figure 6C:
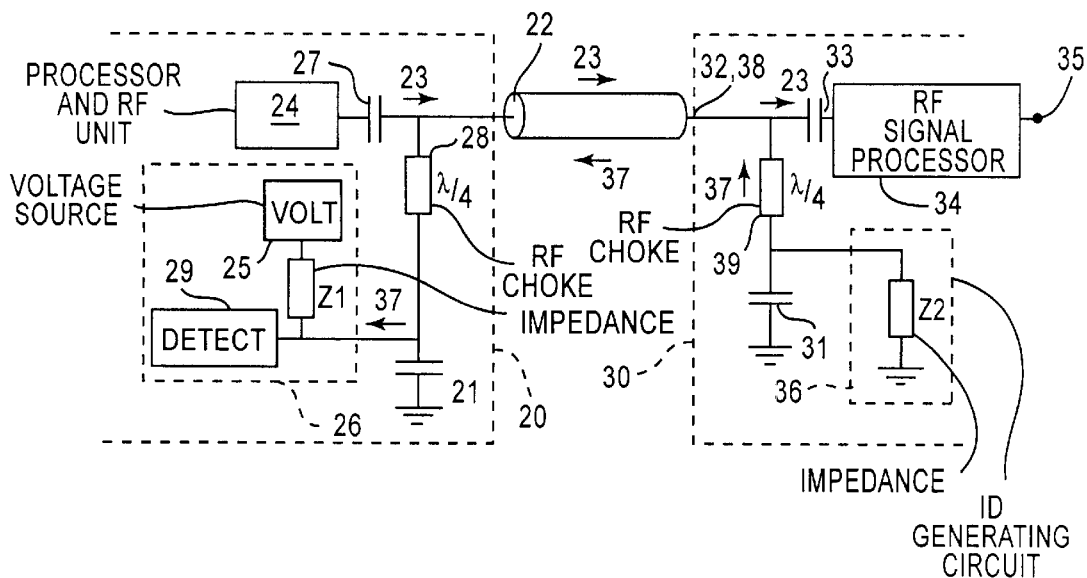
FIG. 6c is a schematic implementation of the embodiment of FIG. 6b.

Reference is now made to FIGS. 6a to 6c which illustrates an ID generating circuit 36 in combination with an interrogation circuit 26 in which the power for the ID signal 37 is supplied by the BTS module 20.

FIG. 6a is a schematic illustration of a base transceiver system 10 (as previously illustrated in FIG. 4)in which the BTS module 20 supplies power to the functional module 30 thereby allowing the functional module to provide an ID signal 37. The functional module 30 has an ID generating circuit 36 which contains an impedance Z2 connected between ground and the ID port 38. The BTS module 20 has an interrogation circuit 26 which contains a voltage source 25, an impedance Z1 and a voltage level detection circuit 29. The BTS module 20 and the functional module 30 are connected to form a voltage divider circuit in which the impedances Z1 and Z2 are series connected between ground in the functional module 30 and the voltage source 25 in the BTS module 20. The voltage level detection circuit 29 measures the voltage across the impedance Z2 (or Z1). Consequently for a known voltage source 25, different values of Z2 will characterise different types of functional modules 30.

In the frequency range of the RF signals the input impedances and the output impedances of connecting modules are generally matched to prevent wave reflections. The input impedance to a module, within the RF frequency range, will typically be 50 Ohms. However, by design, at d.c. the functional modules of different type can have different impedance values and the modules of the same type can have the same impedance value. Thus, if the interrogation circuit sends an interrogation signal to the functional module, the measured impedance of the functional module, the ID signal, identifies the type of functional module.

In the described embodiment the voltage source 25 provides a fixed d.c. voltage and the impedances Z1 and Z2 are resistances. The voltage level detection circuit 29 measures the voltage level received and identifies the attached functional module 30. The identification may be achieved by comparison of the measured voltage level with stored voltage level values, where each of the stored voltage level values is associated with a particular type of functional module 30.

The identification of the functional module may occur continuously. Alternatively the ID generating circuit 36 may be enabled only for a short period, for example, when the functional module 30 is first attached to the BTS module or during an initiation sequence of the base transceiver system 10.

FIG. 6b illustrates a base transceiver system 10 utilising the circuitry of FIG. 6a, in which the RF signals 23 and the ID signal 37 pass between the BTS module 20 and the functional module 30 along a common interconnect. The common interconnect may be a coaxial cable 41 as illustrated in FIG. 6b. The numerals of FIG. 6b, where common with FIG. 4 and FIG. 6a, refer to the same features. In functional module 30 the input 32 and the ID port 38 are common. The RF signal 23 received through this common port 32,38 pass to the RF signal processor 34. The ID signal 37 produced in the ID generating circuit 36 passes to the BTS module 20 through this common port 32,38 and the coaxial cable 41. The BTS module 20 has, as before, functional circuity 24 for providing the RF signals 23 which are presented at output 22 and pass along coaxial cable 41. The interrogation circuit 26 (in this case comprising a voltage level detection circuit 29) receives the ID signal 37 from the coaxial cable 41. The voltage level of the ID signal 37 is detected by the voltage level detector 29. The ID signal 37 developed across Z2 passes through the common interconnect to be measured by the voltage level detection circuitry 29. The ID signal 37 depends upon the response of the voltage divider circuit to excitation by the interrogation signal.

FIG. 6c illustrates how the diagrammatic circuit of FIG. 6b -might be implemented. The reference numerals of FIG. 6c which are common with FIG. 6b refer to the same features. The coaxial cable 41 supplies the RF signals 23 and the d.c. interrogation signal from the BTS module 20 to the functional module 30 and the ID signal 37 from the functional module 30 to the BTS 20. Use is made of an RF choke, for example an inductance or quarter wave track, and capacitors. The capacitor 33 is connected between the common port 32,38 and RF signal processor 34. The capacitor 33 offers a low impedance to high frequency RF signals 23 and a high impedance to the d.c. ID signal 37 and interrogating signal, and consequently isolates the RF signal processor 34 from the ID signal 37 and the interrogating signal but does not prevent the supply of the RF signals 23. The capacitor 27 in the BTS module 20, connected between the coaxial cable 41 and functional circuitry 24 operates in an equivalent manner with respect to the functional circuity 24. The RF choke 39 is connected between the common port 32,38 and the ID generating circuit 36. The RF choke 39 offers a high impedance to the high frequency RF signals 23 and a low impedance to the d.c. ID signal 37 and interrogation signal. The RF choke 39 consequently isolates the voltage generator 36 from the RF signals 23 while not preventing the passage of the ID signal 37 and interrogation signal. The RF choke 28 in the BTS module 20 operates in an exactly analogous manner. A capacitor 31 in the functional module 30 is connected between the node connecting the output of the ID generating circuit 36 to the RF choke 39, and earth. It provides a low impedance path to earth for high frequency signals. The capacitor 21 in the BTS module 20 operates in an analogous manner.

The interrogation signal and the responsive ID signal 37 travel through the RF choke 39, common port 32,38, coaxial cable 41, and RF choke 28; the ID signal being received at the interrogation circuit 26. The RF signals produced in the functional circuitry 24 pass through capacitor 27, the coaxial cable 41, capacitor 33 and are received at the RF unit 34.

Figure 7:
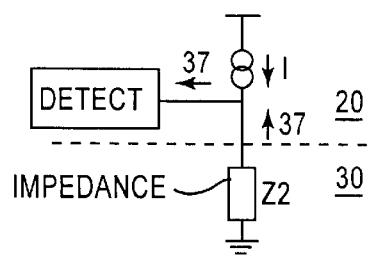
FIG. 7 is a diagram illustrating the replacement of a voltage source with a current source in the earlier embodiments.

FIGS. 6a to 6c illustrate a BTS module 20 which supplies the energy for producing the ID signal 37. The energy supply in each of these figures was a voltage source 25. In FIG. 7 an alternative arrangement is illustrated in which the voltage source 25 and impedance Z1 in the interrogation circuit 26 of the BTS module 20 are replaced by a current source. The current source supplies the power (the interrogation signals) for producing the ID signal 37.

Reference will now be made to FIGS. 8 to 12 to illustrate specific although particularly advantageous implementation of the present invention.

Figure 8:
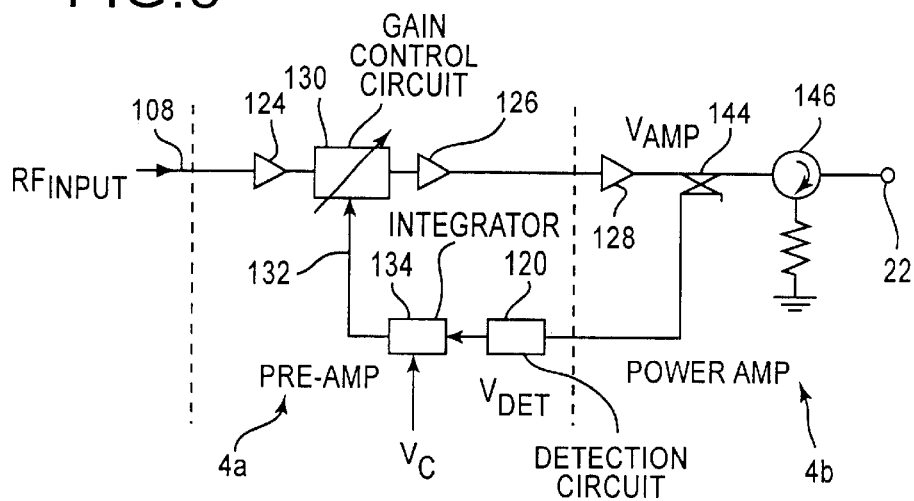
FIG. 8 is a circuit diagram of the power levelling loop within a transceiver module.
Figure 9:
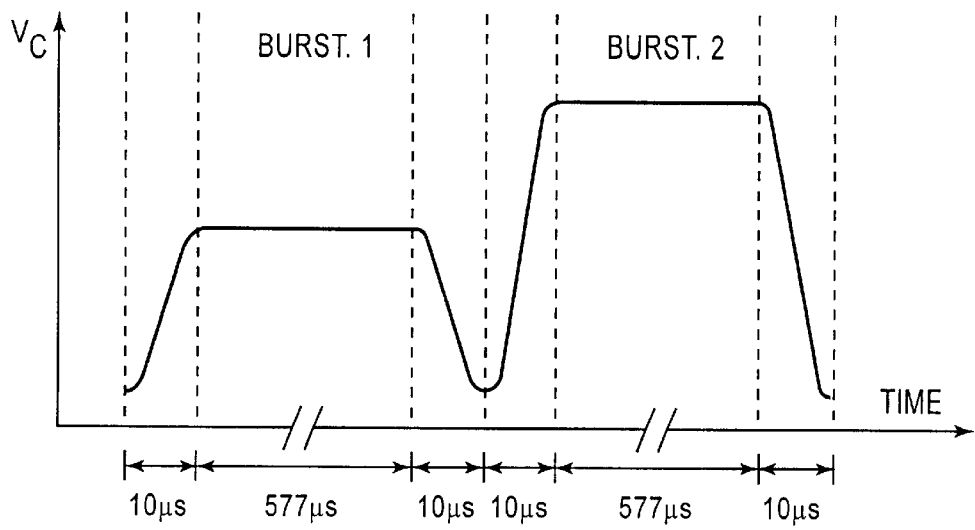
FIG. 9 is a timing diagram of a signal burst in a TDMA system.
Figure 11:
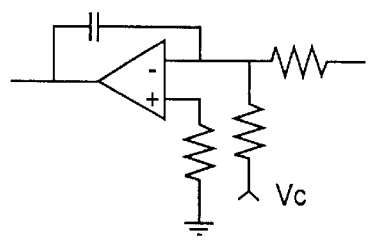
FIG. 11 is a diagram of an integrator suitable for use in the circuit of FIG. 10.
Figure 10:
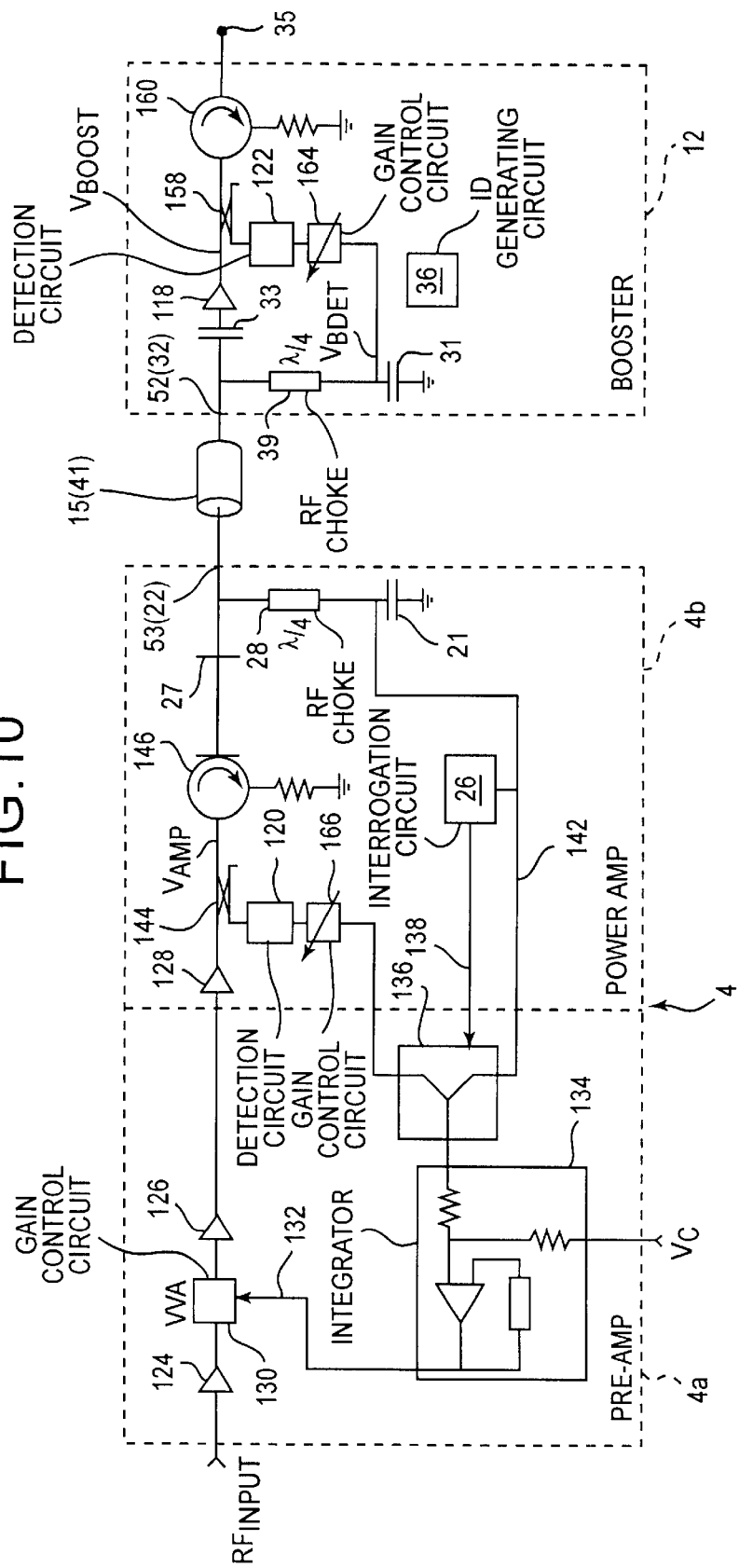
FIG. 10 is a circuit diagram showing the configuration of the power levelling loop with a booster module present.

FIG. 8 illustrates a power levelling loop within a transceiver TRX. An amplifying circuit 4 includes a pre amp stage 4a with first and second pre amp amplifiers 124,126 and a power amp stage 4b with a power RF amplifier 128. The pre amp stage 4a receives the modulated carrier wave as the RF input signal 108. The pre amp stage 4a also includes a gain control circuit 130, for example a variable voltage attenuator (VVA). The VVA 130 is connected between the first and second amplifiers 124,126 and receives a control input 132 from a comparator circuit comprising an integrator 134. The integrator 134 is a standard integrator and will not be described further herein although some of its components are shown in FIG. 10. A suitable integrator is shown in FIG. 11. The RF signal 108 which is input to the pre amp stage 4a is amplified by the first RF amplifier 124 before being supplied to the VAA 130 and the second amplifier 126. The second amplifier 126 further amplifies the signal in dependence on the attenuation set at the VVA 130 by the control signal 132. The thus amplified signal is supplied to the power RF amplifier 128 which implements the bulk of the power amplification. The amplified signal Vamp is supplied to the filter circuit 3 via a circulator 146. Reference numeral 22 represents the connecter to the filter circuit 3.

The integrator 134 receives a detected voltage level Vdet which represents the peak voltage of the amplified signal Vamp from the power amplifier 128. The detected voltage level is detected by a detection circuit 120 from a proportion of the amplified signal derived from a power coupler 144. This can be implemented as an edge coupled, parallel line, microstrip hybrid directional coupler. The integrator also receives the power control signal Vc from the processor 7 and determines the difference 132 between Vc and Vdet. The power control signal Vc takes the form a voltage envelope for defining the voltage levels and ramp times for each signal burst in a TDMA system as exemplary illustrated in FIG. 9. The ramp times and duration for each burst is set according to the GSM standard. Typical values are 10 $\mu$s for the ramp times and 577 $\mu$s for the duration of the burst. The amplitude of the voltage envelope depends on the required power level and this is set according to a number of different parameters, including the cell size in a cellular mobile communication network, the power efficiency of the antenna and the reported signal strength by the mobile station. The difference between Vc and Vdet 132 is applied to the VVA 130 to control its attenuation. Thus, a power levelling loop is established.

FIG. 8 represents an existing power control architecture for a transceiver, in which all the amplifier stages are included within the power levelling loop. However, for an extended cell application, a power booster may sometimes be necessary. As it is also necessary to accurately control the boosted power level, it is desirable to place the booster within the power levelling loop.

FIG. 10 is a circuit diagram showing the configuration of the power levelling loop with the booster module 12 present. Like numerals denote like parts as in FIG. 8. The circuit of FIG. 10 is similar to that described and illustrated in our earlier copending British Patent Application No. 9706423.2, the contents of which are herein incorporated by reference.

The booster module 12 contains an RF amplifier 118 which provides a boosted signal Vboost. The power amplifier circuit 4 contains a first one of two peak detectors 120. A second one of the two peak detectors 122 is connected in the booster circuit 12 after the RF amplifier. A portion of the boosted signal Vboost is coupled into the second detector 122 via a coupler 158. In the described embodiment the coupler is an edge coupled, parallel line, microstrip hybrid directional coupler, although other implementations are possible. The main component of the boosted signal Vboost is supplied to the output connecter 35 via a circulator 160 for supply to the filter circuit. The second detector 122 supplies a detected voltage level $V_{BDET}$ representative of the peak voltage of the RF boosted signal Vboost. The output signal from the second detector 122 is transmitted back to power levelling circuitry 130,134 of the power amplifier 4 via the coaxial cable 15.

The coaxial cable 15 both supplies the amplified signal Vamp from the power amplifier 4 to the booster 12 and returns the detected level $V_{BDET}$ of the boosted signal from the booster 12 to the TRX 2. This is achieved by use of an RF choke 39, for example an inductance or quarter wave track, and capacitors 33 and 31. The RF choke 39 and the capacitor 31 are connected in series between the input connector 52 (32) and ground. The capacitor 33 is connected between the input connector 52 (32) and the RF boost amplifier 118. The detected level $V_{BDET}$ is supplied to the RF choke 39 at its connection to the capacitor 31.

It will be appreciated that the detected level $V_{BDET}$ varies very slowly and may be at a constant d.c. level for extended periods. Its frequency of variation is related to the burst frequency of TDMA bursts. In any event, a capacitor represents an open circuit to the detected level $V_{BDET}$, while the RF choke represents a low resistance path. Thus, the detected level is transmitted through the RF choke 39, via the coaxial cable 15 to the transceiver TRX2 output 53 (22). It is prevented from affecting the RF amplifier 118 by virtue of the capacitor 33. A similar RF choke and capacitor arrangement is provided in the power amp stage 4b of the TRX to receive the detected level $V_{BDT}$. Thus, a capacitor 27 prevents the detected level from feeding back to the power amp 128 while an RF choke 28 transmits it along line 42 to the pre amp stage 4a.

The line 142 is fed through to the pre amp stage 4a to supply the detected level of the boosted signal $V_{BDET}$ to one input of a three terminal switch 136. A second input of the switch 136 receives the detected level Vdet of the amplified signal from the original power levelling loop as described above with reference to FIG. 8.

The switch 136 in the pre amp stage 4a is used to apply to the integrator 134 either the output Vdet from the first detector 120 or the output $V_{BDET}$ from the second detector 122, if the booster is fitted. A control signal 138 determines which input is applied to the integrator 134.

Figure 12:
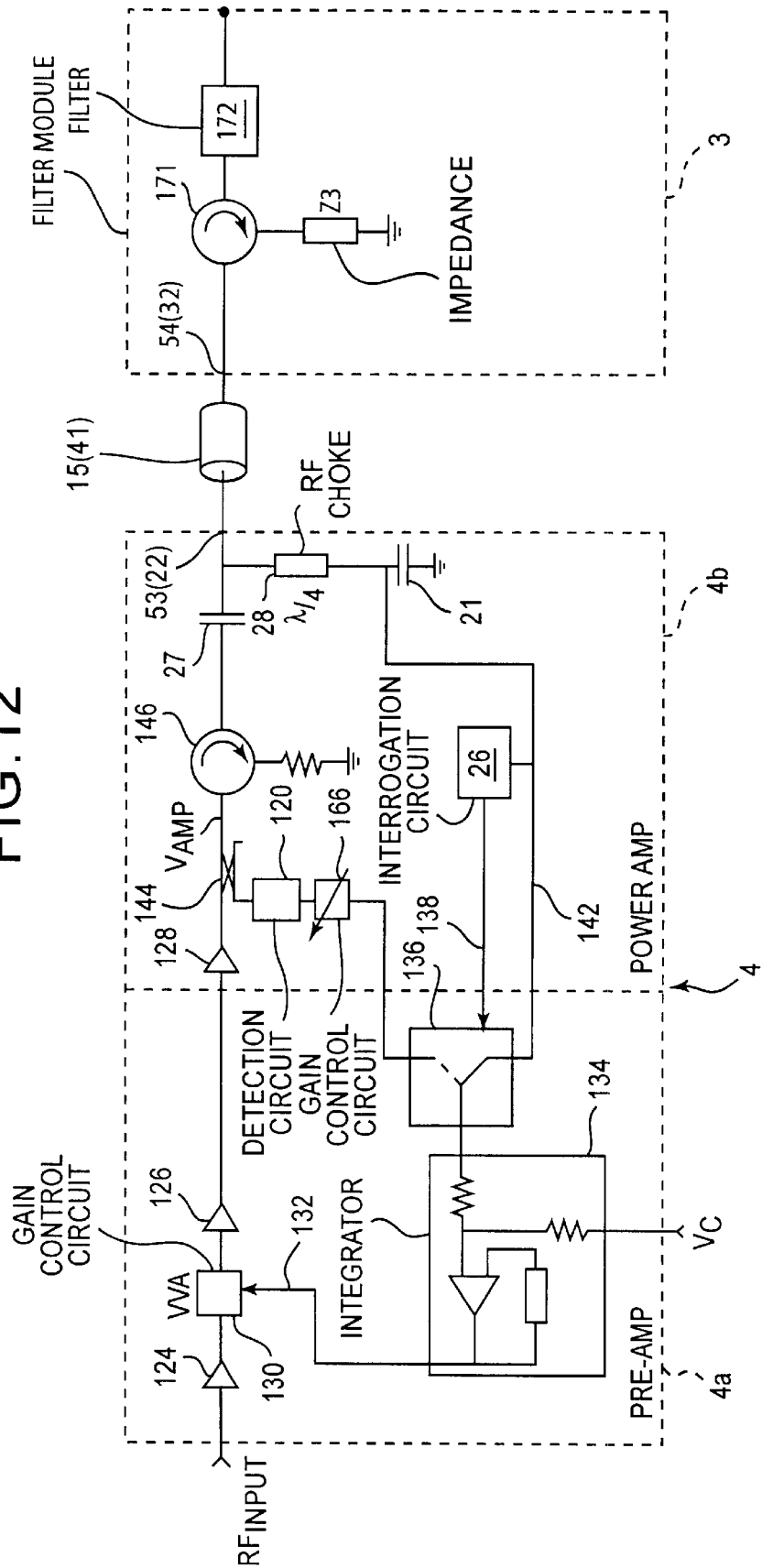
FIG. 12 is a diagram of the transceiver module with a filter module connected thereto.

The control signal 138 is supplied by interrogation module 26 which receives an input from line 142. The input to the interrogation module 26 is provided by the ID generating circuit 36 housed within the booster 12 which is connected to a node between RF choke 39 and capacitor 31. The connection of the interrogation module 26 with the ID generating circuit 36 is achieved in the manner as illustrated in FIGS. 5c and 6c and these circuit operate in the manner as described in relation to these figures. In particular the ID generating circuit 36 produces an ID signal 37 which identifies the connection of a booster 12 to the output node 53 (acting as the RF output 22). The signal when detected by the detection circuitry within the interrogation module 26 produces a control output 138. This output controls the switch 136 and ensures that the line 142 is connected to the integrator 134. In one implementation according to FIG. 6c the ID generating circuit 36 will have an impedance Z2 which does not equal 50 Ohms. Reference is now made to FIG. 12. This figure is the same as FIG. 10 except that the booster module 12 has been replaced by an antennae filter module 3. The antennae filter module 3 includes a circulator 171. The circulator is connected to common port 54 (32) which connects via coaxial cable 15 to the Power Amp circuit 4b; to an impedance Z3 which is connected to earth; and to functional circuitry 172 which operates to filter the RF signals received through the coaxial cable 15. The impedance Z3 may be the characteristic impedance of the coaxial cable 15, for example 50 Ohms. In the circuit of FIG. 12 the impedance Z3 and the connection between ground and the circulator 171 operates like an ID generating circuit 36. This ID generating circuit is sufficiently different from the ID generating circuit of FIG. 10 so that the interrogation module 26 can discriminate between the presence of a booster and a filter. The interrogation module 26 will on the basis of the signal received on line 142 control switch 136. In this instance as the interrogation module has not identified the presence of a booster circuit 12 connected at the output of the power amp 4b, the interrogation module is not effective at controlling the switch 136 to connect the line 142 with the integrator 134. Consequently the power control loop of the circuitry illustrated in FIG. 12 is equivalent to that illustrated in FIG. 8.

It should be appreciated that the controlling of the switch 136 depends upon the sensitivity of the interrogation module, and the differences in the ID generating circuits of FIGS. 10 and 12, that is, Z3 is sufficiently different from Z2.

Thus, with the circuitry as illustrated in FIG. 12, when the booster is not present and the power amp 4b is connected to a filter the power amplified signal Vamp has its level controlled via the power levelling loop constituted by the first detector 120, integrator 134 and attenuation circuitry 30 and is generated at the output node 53 (22) of the TRX for supply to the filter module 3. When the booster module 12 is present, as illustrated in FIG. 10 the boosted power signal Vboost has its level controlled via the power levelling loop comprising the second detector 122, transmitting circuitry in the form of RF choke 39, receiving circuitry in the form of RF choke 28, integrator 134 and attenuation circuitry 130. The levelled, boosted power signal Vboost is then supplied at the output connector 35 of the booster to the filter module 3.

The coaxial cable 15 is used for the transmission of the detected level of the boosted signal $V_{BDET}$ back to the amplification stages 4a,4b. The coaxial cable is also used to transmit the power amplified signal Vamp to the booster module 12. The signal Vamp is at RF frequencies of the order of 900 MHz for the GSM standard (other frequencies apply in other standards), and thus cannot pass through the RF chokes 39,28. These thus prevent that RF signal Vamp from travelling down line 142 or from affecting the second detector 22. The capacitors 33,27 will pass the RF signal because of its high frequency. Thus, the coaxial cable 15 provides a transmission path for both the amplified RF signal Vamp and the d.c. detected level $V_{BDET}$. Thus, the power levelling loop can be closed in a simple and effective manner. In particular, it does not require any modifications to the backplane of the rack 11 when the booster module 12 replaces the transceiver module TRX 1.

The system described above in relation to FIGS. 10 to 12 makes use of the existing cabling between the output of the transceiver and the input of the booster, therefore minimising the changes to other modules at the BTS. The possibility of noise pick-up is minimised, since the feedback path is maintained in a coaxial cable and does not pass near any high speed digital signal lines. The system described above has the booster module within the BTS. It would however be possible to move the booster module from the BTS, for example to the masthead, increasing the length of the coaxial cable. The effect of any propagation delays would have to be taken into account.

In the system described above in relation to FIGS. 10 to 12, the detected voltage level of the boosted signal is fed back to the power levelling loop as an analogue voltage. Alternatively, it could be fed back in a digitised form which would increase the signal to noise ratio, but would require the use of an A to D converter.

Another way in which the voltage output of the detector in the booster may be fed back to the preamp is if it was modulated onto a carrier frequency. For instance, this could take the form of 100 MHz FM modulated carrier generated in the booster, transmitted onto the coaxial cable by means of a duplexer and extracted by another duplexer at the other end of the coaxial cable. This carrier could then be demodulated and the original detector signal restored. Depending on the difference between the main carrier frequency and the feedback carrier frequency, a duplex filter may be required to multiplex these signals in place of the choke system described above.

The circuit of FIG. 10, provides a power levelling loop for a base transceiver system comprising: first amplification circuitry connected to receive an RF input signal and to supply a first amplified signal to an output node; first detection circuitry for detecting said first amplified signal and connectable to modify the amplification factor of the first amplification circuitry in dependence on the detected level of the first amplified signal; automatic switch circuitry having a first input connected to the first detection circuitry and a second input connected to means for receiving a detected level of a second amplified signal, the switch being controllable to select the first or second input, wherein when the second input is selected the amplification factor of the first amplification circuitry is modified in accordance with the detected level of the second amplified signal.

Although the unit 34 has been identified as an RF signal processor, in other implementations it could perform DSP functions with the signal 23 being a digital signal.

Figure 13A:
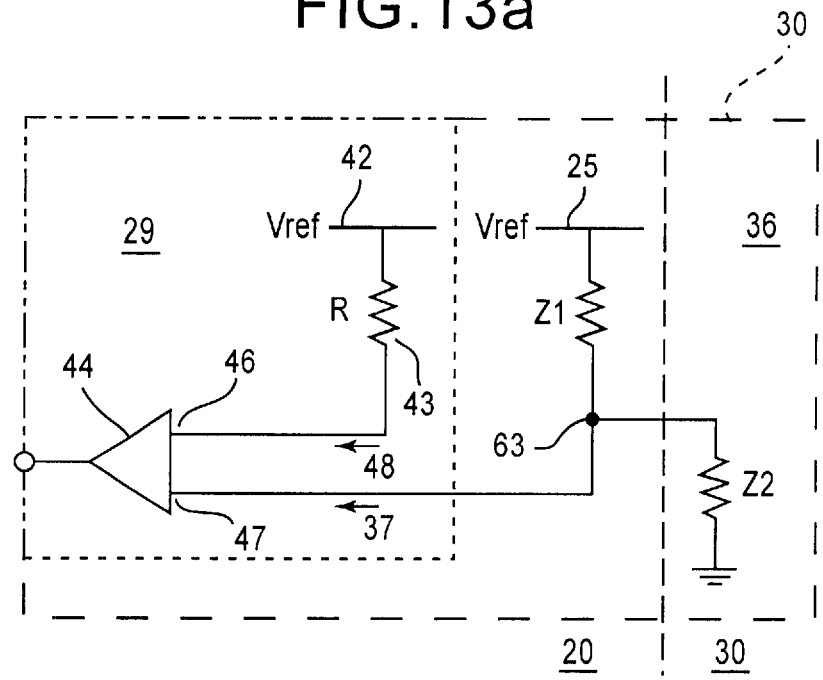
FIG. 13a is an illustrative example of the voltage level detection circuit 29 shown in FIGS. 6a to 6c.
Figure 13B:
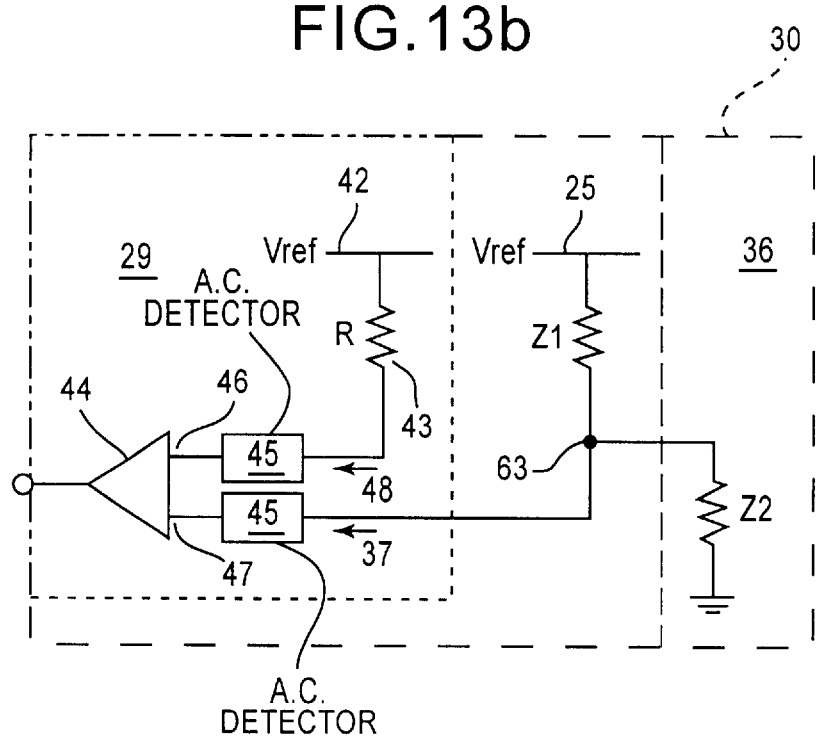
FIG. 13b is another illustrative example of the voltage level detection circuit 29 shown in FIGS. 6a to 6c.
Figure 13C:
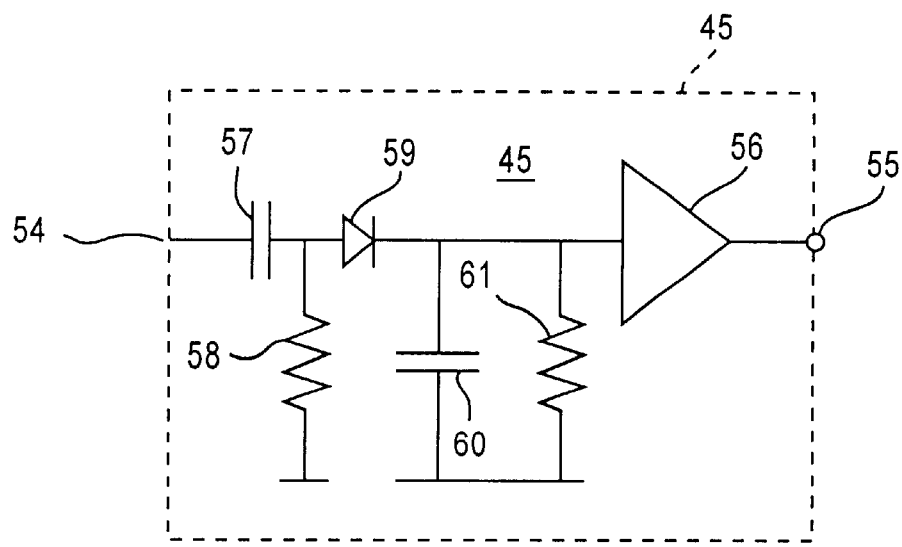
FIG. 13c illustrates an a.c. detector 45 suitable for use in the voltage level detection circuit 29 of FIG. 13b.

Reference is now made to FIGS. 13a to 13c which illustrate implementations of the voltage level detection circuit 29 previously referred to in those portions of the text referring to FIGS. 6a to 6c. The reference numerals in FIGS. 13a to 13c which are common with those used in FIGS. 6a to 6c refer to the same structural elements.

The BTS module 20 and the functional module 30 are connected to form a voltage divider circuit in which the impedances Z1 and Z2 are series connected between ground in the functional module 30 and the voltage source 25 in the BTS module 20. The voltage level detection circuit 29 receives an input (ID signal 37) from a voltage node 63 situated between impedances Z1 and Z2. The voltage level detection circuit 29 compares the voltage at this voltage node 63 with a reference voltage. The comparison is performed by comparator 44 which has two inputs: an input node 47 and a reference node 46. The input node 47 receives the ID signal 37 and the reference node 46 is connected to a reference voltage 42 through a resistor 43 and receives a reference signal 48. The reference voltage 42 is the same voltage as that of the voltage source 25. The output of the comparator 44 consequently depends upon the value of R, Z1 and Z2. Therefore, different values of Z2 can characterise different functional modules 30. The voltage level detection circuit 29 illustrated in FIG. 13a is utilised when the voltage source 25 provides a d.c. voltage. The output of the comparator 44 can for example be used to control a switch as illustrated in FIGS. 10 and 12.

When the voltage source 25 provides an a.c. voltage the voltage level detector circuit 29 illustrated in FIG. 13b should be implemented. The reference numerals in FIG. 13b which are common to those in FIG. 13a refer to the same structural elements. FIG. 13b differs from FIG. 13a in that an a.c. detector 45 having input 54 and output 55 processes each of the inputs to the comparator 44. A first a.c. detector 45 is placed between the reference node 46 of the comparator 44 and the resistor 43. It receives the reference signal 48 at its input 54 and its output 55 is connected to the input node 47 of the comparator 44. A second a.c. detector 45 is placed between the input node 47 of the comparator 44 and the voltage node 63. It receives the ID signal 37 at its input 54 and its output 55 is connected to the input node 47 of the comparator 44. The a.c. detectors 45 process the received a.c. signals (ID signal 37 and reference signal 48) and provide d.c. signals at the input node 47 and reference node 46 of the comparator 44 which are representative of the a.c. levels of the ID signal 37 and reference signal 48, respectively.

FIG. 13c illustrates a suitable a.c. detector 45: a diode detector. The detector 45 has an input 54 for receiving an a.c.

signal and an output 55 for providing a d.c. signal, proportional to the slowly varying amplitude of the received a.c. signal. The detector 45 includes the following components: capacitors 57 and 60, resistors 58 and 61, diode 59 and buffer 56. Resistors 58 and 61 and capacitor 60 are connected to earth. The components of the detector are chosen to provide an output signal proportional to the amplitude of the received a.c. signal at the frequency of the voltage source (also the frequency of the reference voltage 25). This frequency is outside the RF frequency range and preferably significantly lower than the RF frequency.

Figure 14:
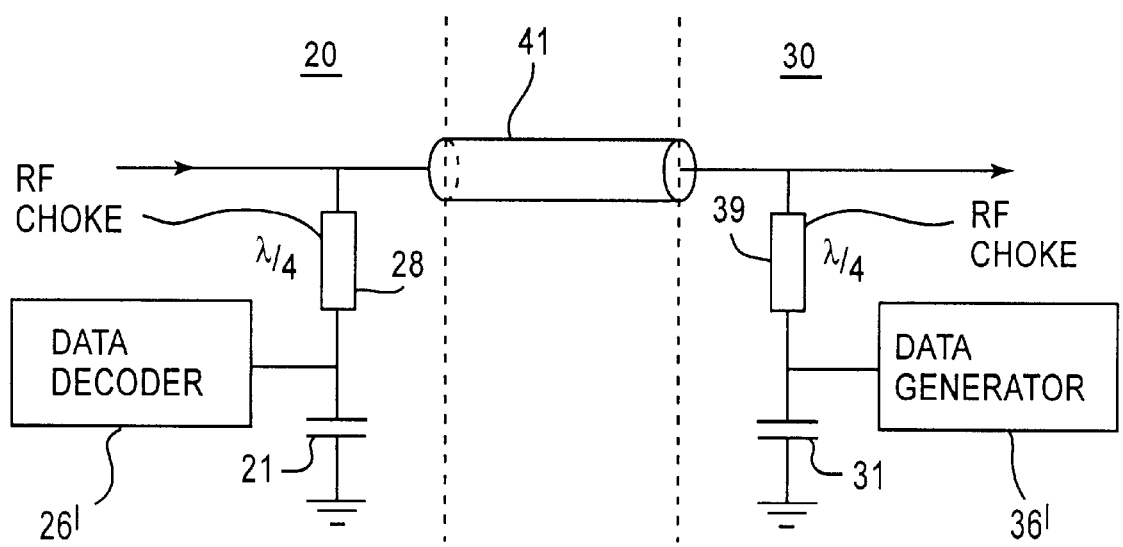
FIG. 14 illustrates a further embodiment of the present invention.

FIG. 14 illustrates a further embodiment of the present invention where like numerals denote like parts as in FIGS. 5a to 5c. The implementation operates in a similar manner except that the ID generating circuit is replaced by a data generator 36', and the interrogation circuit is replaced by a data decoder 26'. The data generator generates a data stream which uniquely identifies the functional module 30 and this is transmitted along the coaxial cable 41, for example using the biphase format (also referred to as "Manchester" encoding. The data decoder decodes the signal to identify the functional module.

What is claimed is:

1. A self configuring transceiver module, for use in a modular transceiver system of a radio communication network operating at an RF frequency within an RF frequency range, the transceiver module comprising:

an RF unit for generating and receiving RF signals in the RF frequency range;

an ID port for receiving an identification signal from a connected functional module, said identification signal characterising said functional module;

detection circuitry for identifying the nature of the functional module from the identification signal and for configuring the transceiver system in response thereto; and an interrogation circuit for generating an interrogation signal and an output for transmitting the interrogation signal to the connection functional module, said interrogation signal being generated at a frequency which is less than $\frac{1}{10}$ of the RF frequency signal.

2. A system according to claim 1, wherein the interrogation signal and the identification signal are conveyed by a common interconnect.

3. A system according to claim 2, wherein the common interconnect is coaxial cable.

4. A system according to claim 2, wherein the RF signals are also conveyed by the common interconnect.

5. A system according to claim 1, which comprises a power source for generating the interrogation signal.

6. In combination, a self-configuring transceiver system according to claim 1 and a functional module connected thereto which is a power amplification module.

7. In combination, a self-configuring transceiver system according to claim 1 and a functional module connected thereto, wherein the functional module is a filter module.

8. In combination a functional module connected to a self configuring transceiver module, for use in a radio communication network operating at an RF frequency within a RF frequency range, said functional module comprising:

an input for receiving input signals at the RF frequency;

an RF signal processor connected to said input for receiving and processing said input signals;

an ID generating circuit for generating an identification signal characterising the functional module;

an ID port for transmitting the identification signal to an interrogation circuit in the transceiver module, and said self configuring transceiver module comprising:

an RF unit for generating and receiving RF signals in the RF frequency range;

an ID port for receiving the identification signal from the connected functional module, said identification signal characterising said functional module;

detection circuitry for identifying the nature of the functional module from the identification signal and for configuring the transceiver module in response thereto; and an interrogation circuit for generating an interrogation signal and an output for transmitting the interrogation signal to the connected functional module, said interrogation signal being generated at a frequency which is less than $\frac{1}{10}$ of the RF frequency signal.

9. A combination according to claim 8, wherein said functional module comprises a power source for generating the identification signal.

10. A method for automatically identifying a functional module in a modular transceiver system, said system operating within an RF frequency range, the method comprising the steps of:

supplying to the functional module checking signal at a checking frequency outside said RF frequency range, said checking frequency being less than $\frac{1}{10}$ of an operating RF frequency within the RF frequency range;

measuring the response of said functional module at said checking frequency, said response being characteristic of the nature of the functional module; and identifying the nature of the functional module on the basis of the response, and configuring the transceiver system accordingly.

* * * * *